(12) United States Patent
Tan et al.

(10) Patent No.: US 10,727,073 B2
(45) Date of Patent: Jul. 28, 2020

(54) ATOMIC LAYER ETCHING 3D STRUCTURES: SI AND SIGE AND GE SMOOTHNESS ON HORIZONTAL AND VERTICAL SURFACES

(71) Applicant: Lam Research Corporation, Fremont, CA (US)

(72) Inventors: Samantha Tan, Fremont, CA (US); Wenbing Yang, Fremont, CA (US); Keren Jacobs Kanarik, Los Altos, CA (US); Thorsten Lill, Santa Clara, CA (US); Yang Pan, Los Altos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 131 days.

(21) Appl. No.: 15/423,486

(22) Filed: Feb. 2, 2017

(65) Prior Publication Data

US 2017/0229314 A1 Aug. 10, 2017

Related U.S. Application Data

(60) Provisional application No. 62/291,392, filed on Feb. 4, 2016.

(51) Int. Cl.
*H01L 21/00* (2006.01)
*H01L 21/3065* (2006.01)
(Continued)

(52) U.S. Cl.
CPC .. *H01L 21/30655* (2013.01); *C23C 16/45536* (2013.01); *C23C 16/45544* (2013.01);
(Continued)

(58) Field of Classification Search
CPC ........... H01L 21/30655; H01L 21/0228; H01L 21/67069; H01J 37/321; H01J 37/32357;
(Continued)

(56) References Cited

U.S. PATENT DOCUMENTS 4,592,801 A 6/1986 Hara et al.
4,756,794 A 7/1988 Yoder
(Continued)

FOREIGN PATENT DOCUMENTS

CN 1455950 A 11/2003
CN 1550575 A 12/2004
(Continued)

OTHER PUBLICATIONS

U.S. Office Action dated Aug. 7, 2017 issued in U.S. Appl No. 15/253,481.
(Continued)

*Primary Examiner* — Richard A Booth
(74) *Attorney, Agent, or Firm* — Weaver Austin Villeneuve & Sampson LLP

(57) ABSTRACT

Methods and apparatuses for etching semiconductor material on substrates using atomic layer etching by chemisorption, by deposition, or by both chemisorption and deposition mechanisms in combination with oxide passivation are described herein. Methods involving atomic layer etching using a chemisorption mechanism involve exposing the semiconductor material to chlorine to chemisorb chlorine onto the substrate surface and exposing the modified surface to argon to remove the modified surface. Methods involving atomic layer etching using a deposition mechanism involve exposing the semiconductor material to a sulfur-containing gas and hydrogen to deposit and thereby modify the substrate surface and removing the modified surface.

20 Claims, 8 Drawing Sheets

(51) Int. Cl.
*H01L 21/02* (2006.01)
*H01L 21/67* (2006.01)
*H01J 37/32* (2006.01)
*C23C 16/455* (2006.01)

(52) U.S. Cl.
CPC ...... *H01J 37/321* (2013.01); *H01J 37/32009* (2013.01); *H01J 37/3244* (2013.01); *H01J 37/32357* (2013.01); *H01J 37/32422* (2013.01); *H01J 37/32651* (2013.01); *H01L 21/0228* (2013.01); *H01L 21/67069* (2013.01); *H01J 2237/334* (2013.01)

(58) Field of Classification Search
CPC ............. H01J 37/32422; H01J 37/3244; H01J 37/32651
See application file for complete search history.

(56) References Cited

U.S. PATENT DOCUMENTS

| | | | |
|---|---|---|---|
| 5,298,451 A | 3/1994 | Rao | |
| 5,411,631 A | 5/1995 | Hori et al. | |
| 5,501,893 A | 3/1996 | Laermer et al. | |
| 6,022,806 A | 2/2000 | Sato et al. | |
| 6,083,413 A | 7/2000 | Sawub et al. | |
| 6,177,353 B1 | 1/2001 | Gutsche et al. | |
| 6,448,192 B1 * | 9/2002 | Kaushik | H01L 21/28167 257/E21.193 |
| 6,482,745 B1 | 11/2002 | Hwang | |
| 6,677,242 B1 | 1/2004 | Liu et al. | |
| 7,049,226 B2 | 5/2006 | Chung et al. | |
| 7,115,522 B2 | 10/2006 | Tomioka et al. | |
| 7,196,955 B2 | 3/2007 | Nickel | |
| 7,795,148 B2 | 9/2010 | Brown | |
| 7,943,527 B2 | 5/2011 | Kumar et al. | |
| 8,110,503 B2 | 2/2012 | Kumar et al. | |
| 8,227,344 B2 | 7/2012 | Selsley et al. | |
| 8,252,194 B2 | 8/2012 | Kiehlbauch et al. | |
| 8,808,561 B2 | 8/2014 | Kanarik | |
| 8,883,028 B2 * | 11/2014 | Kanarik | H01J 37/32082 216/68 |
| 8,993,352 B2 | 3/2015 | Nishimura et al. | |
| 9,130,158 B1 | 9/2015 | Shen et al. | |
| 9,240,315 B1 | 1/2016 | Hsieh et al. | |
| 9,257,638 B2 | 2/2016 | Tan et al. | |
| 9,449,843 B1 | 9/2016 | Korolik et al. | |
| 9,520,821 B1 | 12/2016 | Sheahan | |
| 9,576,811 B2 | 2/2017 | Kanarik et al. | |
| 9,805,941 B2 | 10/2017 | Kanarik et al. | |
| 9,806,252 B2 | 10/2017 | Tan et al. | |
| 9,837,312 B1 | 12/2017 | Tan et al. | |
| 9,870,899 B2 | 1/2018 | Yang et al. | |
| 9,984,858 B2 | 5/2018 | Kanarik et al. | |
| 9,991,128 B2 | 6/2018 | Tan et al. | |
| 9,997,371 B1 | 6/2018 | Agarwal et al. | |
| 10,056,268 B2 | 8/2018 | Li | |
| 10,096,487 B2 | 10/2018 | Yang et al. | |
| 10,186,426 B2 | 1/2019 | Kanarik et al. | |
| 10,269,566 B2 | 4/2019 | Tan et al. | |
| 10,304,659 B2 | 5/2019 | Kanarik et al. | |
| 10,374,144 B2 | 8/2019 | Tan et al. | |
| 10,494,715 B2 | 12/2019 | Agarwal et al. | |
| 10,515,816 B2 | 12/2019 | Kanarik et al. | |
| 10,559,461 B2 | 2/2020 | Reddy et al. | |
| 10,685,836 B2 | 6/2020 | Tan et al. | |
| 2001/0053585 A1 | 12/2001 | Kikuchi et al. | |
| 2002/0009883 A1 | 1/2002 | Ogure et al. | |
| 2002/0058409 A1 | 5/2002 | Lin et al. | |
| 2002/0081381 A1 | 6/2002 | DelaRosa et al. | |
| 2003/0034244 A1 | 2/2003 | Yasar et al. | |
| 2004/0004056 A1 | 1/2004 | Sasaki et al. | |
| 2004/0137749 A1 | 7/2004 | Ying et al. | |
| 2004/0209476 A1 | 10/2004 | Ying et al. | |
| 2005/0006222 A1 | 1/2005 | Ding et al. | |
| 2005/0098440 A1 | 5/2005 | Kailasam et al. | |
| 2005/0112901 A1 | 5/2005 | Ji et al. | |
| 2005/0167399 A1 | 8/2005 | Ludviksson et al. | |
| 2006/0009040 A1 | 1/2006 | Tomioka et al. | |
| 2006/0169669 A1 | 8/2006 | Zojaji et al. | |
| 2006/0194435 A1 | 8/2006 | Nishimura et al. | |
| 2007/0049036 A1 | 3/2007 | Huang | |
| 2007/0202254 A1 | 8/2007 | Ganguli et al. | |
| 2007/0238301 A1 | 10/2007 | Cabral et al. | |
| 2007/0246442 A1 | 10/2007 | America et al. | |
| 2009/0020884 A1 | 1/2009 | Lee et al. | |
| 2009/0075472 A1 | 3/2009 | Arnold et al. | |
| 2009/0226611 A1 | 9/2009 | Suzuki et al. | |
| 2009/0256220 A1 | 10/2009 | Horng et al. | |
| 2010/0048029 A1 | 2/2010 | Kumar et al. | |
| 2010/0190341 A1 | 7/2010 | Park et al. | |
| 2011/0139748 A1 | 6/2011 | Donnelly et al. | |
| 2011/0200762 A1 | 8/2011 | Kumar et al. | |
| 2011/0212274 A1 | 9/2011 | Selsley et al. | |
| 2012/0009785 A1 | 1/2012 | Chandrashekar et al. | |
| 2012/0077349 A1 | 3/2012 | Li et al. | |
| 2012/0115329 A1 | 5/2012 | Chandrashekar et al. | |
| 2012/0276657 A1 | 11/2012 | Joubert et al. | |
| 2013/0105303 A1 | 5/2013 | Lubomirsky et al. | |
| 2013/0115763 A1 | 5/2013 | Takamure et al. | |
| 2013/0129922 A1 | 5/2013 | Sasagawa et al. | |
| 2013/0137267 A1 | 5/2013 | Chang et al. | |
| 2013/0168354 A1 | 7/2013 | Kanarik | |
| 2014/0017898 A1 | 1/2014 | Nemani et al. | |
| 2014/0134847 A1 | 5/2014 | Seya | |
| 2014/0178568 A1 | 6/2014 | Wolff et al. | |
| 2014/0193979 A1 | 7/2014 | Or et al. | |
| 2014/0349469 A1 | 11/2014 | Sasagawa et al. | |
| 2015/0037972 A1 | 2/2015 | Danek et al. | |
| 2015/0111374 A1 | 4/2015 | Bao et al. | |
| 2015/0214474 A1 | 7/2015 | Nishimura et al. | |
| 2015/0235835 A1 | 8/2015 | Swaminathan et al. | |
| 2015/0243883 A1 | 8/2015 | Swaminathan et al. | |
| 2015/0270140 A1 | 9/2015 | Gupta et al. | |
| 2016/0020152 A1 | 1/2016 | Posseme | |
| 2016/0056074 A1 | 2/2016 | Na et al. | |
| 2016/0064244 A1 | 3/2016 | Agarwal et al. | |
| 2016/0079521 A1 | 3/2016 | Draeger et al. | |
| 2016/0203995 A1 | 7/2016 | Kanarik et al. | |
| 2016/0308112 A1 | 10/2016 | Tan et al. | |
| 2016/0314985 A1 | 10/2016 | Yang et al. | |
| 2016/0358782 A1 | 12/2016 | Yang et al. | |
| 2016/0379824 A1 | 12/2016 | Wise et al. | |
| 2017/0040214 A1 | 2/2017 | Lai et al. | |
| 2017/0053810 A1 | 2/2017 | Yang et al. | |
| 2017/0069462 A1 | 3/2017 | Kanarik et al. | |
| 2017/0117159 A1 | 4/2017 | Kanarik et al. | |
| 2017/0125256 A1 | 5/2017 | Lee et al. | |
| 2017/0170036 A1 | 6/2017 | Fischer et al. | |
| 2017/0178920 A1 | 6/2017 | Dole et al. | |
| 2017/0186621 A1 | 6/2017 | Zaitsu | |
| 2017/0229311 A1 | 8/2017 | Tan et al. | |
| 2017/0243755 A1 | 8/2017 | Tapily | |
| 2017/0256416 A1 | 9/2017 | Fischer et al. | |
| 2017/0316935 A1 | 11/2017 | Tan et al. | |
| 2018/0019387 A1 | 1/2018 | Tan et al. | |
| 2018/0033635 A1 | 2/2018 | Kanarik et al. | |
| 2018/0102236 A1 | 4/2018 | Yang et al. | |
| 2018/0233325 A1 | 8/2018 | Kanarik et al. | |
| 2018/0308680 A1 | 10/2018 | Reddy et al. | |
| 2018/0308695 A1 | 10/2018 | LaVoie | |
| 2018/0327913 A1 | 11/2018 | Lansalot-Matras et al. | |
| 2019/0131130 A1 | 5/2019 | Smith et al. | |
| 2019/0139778 A1 | 5/2019 | Kanarik et al. | |
| 2019/0244805 A1 | 8/2019 | Tan et al. | |
| 2019/0312194 A1 | 10/2019 | Tan et al. | |
| 2020/0118809 A1 | 4/2020 | Reddy et al. | |
| 2020/0161139 A1 | 5/2020 | Kanarik et al. | |

FOREIGN PATENT DOCUMENTS

| | | |
|---|---|---|
| CN | 1552097 A | 12/2004 |
| CN | 1675517 A | 9/2005 |
| CN | 101015047 A | 8/2007 |

(56) References Cited

FOREIGN PATENT DOCUMENTS

| CN | 101388359 A | 3/2009 |
|---|---|---|
| CN | 101809711 A | 8/2010 |
| CN | 104249070 A | 12/2014 |
| CN | 105789027 A | 1/2015 |
| EP | 0987745 A1 | 3/2000 |
| EP | 1469511 A2 | 10/2004 |
| JP | 3-133128 A | 6/1991 |
| JP | 2010-283357 A | 12/2010 |
| JP | 2013-235912 A | 11/2013 |
| JP | 5416280 B2 | 2/2014 |
| TW | 200425247 A | 11/2004 |
| TW | 2011/40687 A | 11/2011 |
| TW | 201219595 A | 5/2012 |
| TW | 2013/40209 A | 10/2013 |
| WO | WO 9936956 A1 | 7/1999 |
| WO | WO 0215249 A2 | 2/2002 |
| WO | WO 2004/015727 A2 | 2/2004 |
| WO | WO 2011/081921 A2 | 7/2011 |
| WO | WO 2016/100873 A1 | 6/2016 |
| WO | WO 2017/099718 A1 | 6/2017 |

OTHER PUBLICATIONS

U.S. Office Action dated May 5, 2016 issued in U.S. Appl. No. 14/749,285.
U.S. Final Office Action dated Sep. 23, 2016 issued in U.S. Appl. No. 14/749,285.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Office Action dated Nov. 28, 2016 issued in U.S. Appl. No. 14/749,291.
U.S. Notice of Allowance dated Jun. 30, 2017 issued in U.S. Appl. No. 14/749,291.
U.S. Office Action dated Jul. 1, 2016 issued in U.S. Appl. No. 14/830,683.
U.S. Final Office Action dated Feb. 7, 2017 issued in U.S. Appl. No. 14/830,683.
U.S. Office Action dated Jul. 25, 2017 issued in U.S. Appl. No. 14/830,683.
U.S. Office Action dated Aug. 25, 2017 issued in U.S. Appl. No. 15/239,138.
Boullart et al. (Mar. 29, 2013) "STT MRAM patterning challenges," *Proc. SPIE , Advanced Etch Technology for Nanopatterning II, Proc. of SPIE* 8685:86850F-1-86850F-9 [Retrieved on Jun. 2, 2015 from http://proceedings.spiedigitallibrary.org].
Carver et al. (Feb. 20, 2015) "Atomic Layer Etching: An Industry Perspective," *ECS Journal of Solid State Science and Technology*,4(6):N5005-N5009.
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from *Semiconductor Manufacturing Magazine*, 7 pp.
Faraz et al. (2015) "Atomic Layer Etching: What Can We Learn from Atomic Layer Deposition?," *ECS Journal of Solid State Science and Technology*, 4(6):N5023-N5032.
Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," *Organometallics*, 17(26):5810-5819.
Kanarik et al. (Mar./Apr. 2015) "Overview of atomic layer etching in the semiconductor industry," *J. Vac. Sci. Technol. A*, 33(2):020802-1-020802-14.
Kim et al. (Nov./Dec. 2013) "Atomic layer etching removal of damaged layers in a contact hole for low sheet resistance," *J. Vac. Sci. Technol. A*, 31(6):061302-1-061302-7.
Lee et al. (2015) "Atomic Layer Etching of $Al_2O_3$ Using Sequential, Self-Limiting Thermal Reactions with $Sn(acac)_2$ and Hydrogen Fluoride," $^{ACS}NANO$,9(2):2061-2070.
Moroz, Paul (Jul. 1-2, 2015) "Numerical Simulation of Atomic Layer Etching," Atomic Layer Etching Workshop, Portland, Oregon, USA; *Tokyo Electron U.S. Holdings, Inc.*, 15pp.
Park, S.D. et al., (Sep. 22, 2005) "Surface Roughness Variation during Si Atomic Layer Etching by Chlorine Adsorption Followed by an Ar Neutral Beam Irradiation," *Electrochemical and Solid-State Letters*, 8(11):C177-C179, 1 page [Abstract Only].
Pomeroy, R.K. and Wijesekera, K.S. (1980) "Preparation and derivatives of cis-$M(CO)_{4(SiCl3)_2\ (M=Fe,\ Ru,\ Os)}$," *Inorg. Chem.*, 19(12):3729-3735.
Schmitt et al. (2006) "Synthesis and Properties of Single-Crystal FeSi Nanowires," *Nano Lett.*, 6(8):1617-1621.
Schmitt et al. (Feb. 1, 2008) "Chemical Synthesis and Magnetotransport of Magnetic Semiconducting $Fe_{1-x}Co_x$ Si Alloy Nanowires," *Nano Lett.*, 8(3):810-815.
Wolf, S. And Tauber, R.N. (1986) "Silicon Processing for the VLSI Era," *Volume 1—Process Technology, Lattice Press*, pp. 542-557.
U.S. Office Action dated Jun. 17, 2016 issued in U.S. Appl. No. 14/696,254.
U.S. Notice of Allowance dated Oct. 14, 2016 issued in U.S. Appl. No. 14/696,254.
U.S. Notice of Allowance dated Jun. 29, 2017 issued in U.S. Appl. No. 15/400,368.
Puurunen, Rikka L. (2005) "Surface chemistry of atomic layer deposition: A case study for the trimethylaluminum/water process," *Journal of Applied Physics*, 97:121301-51 pages.
Gottscho, Richard (Jul. 16, 2017) "Atomic Layer Etching—An Overview of Possibilities and Limitations," *Plenary Talk presented at American Vacuum Society 17th International Conference on Atomic Layer Deposition (ALD 2017) and 4th International Atomic Layer Etching Workshop (ALE 2017)*, Lam Research Corp., 21pp.
U.S. Appl. No. 15/286,421, filed Oct. 5, 2016, Tan et al.
U.S. Appl. No. 15/719,497, filed Sep. 28, 2017, Tan et al.
U.S. Appl. No. 15/799,675, filed Oct. 31, 2017, Smith et al.
U.S. Appl. No. 15/581,951, filed Apr. 28, 2017, Reddy et al.
U.S. Appl. No. 15/582,359, filed Apr. 28, 2017, Agarwal et al.
U.S. Appl. No. 15/719,484, filed Sep. 28, 2017, Kanarik et al.
U.S. Office Action dated Mar. 24, 2017 issued in U.S. Appl. No. 15/286,421.
U.S. Notice of Allowance dated Sep. 28, 2017 issued in U.S. Appl. No. 15/286,421.
U.S. Notice of Allowance [Supplemental Notice of Allowability] dated Oct. 26, 2017 issued in U.S. Appl. No. 15/286,421.
U.S. Notice of Allowance dated Oct. 6, 2017 issued in U.S. Appl. No. 15/582,359.
U.S. Office Action dated Mar. 29, 2018 issued in U.S. Appl. No. 15/719,484.
Chinese First Office Action dated Dec. 27, 2017 issued in Application No. CN 201610017911.4.
U.S. Final Office Action dated Jan. 25, 2018 issued in U.S. Appl. No. 15/253,481.
U.S. Notice of Allowance dated Feb. 12, 2018 issued in U.S. Appl. No. 15/253,481.
U.S. Appl. No. 15/824,987, filed Nov. 28, 2017, Yang et al.
U.S. Notice of Allowance dated Jan. 26, 2018 issued in U.S. Appl. No. 15/582,359.
U.S. Notice of Allowance dated Sep. 11, 2018 issued in U.S. Appl. No. 15/719,484.
U.S. Office Action dated Dec. 14, 2018 issued in U.S. Appl. No. 15/719,497.
U.S. Office Action dated Nov. 1, 2018 issued in U.S. Appl. No. 15/581,951.
Chinese Second Office Action dated Aug. 31, 2018 issued in Application No. CN 201610017911.4.
Singapore Search Report and Written Opinion dated Jun. 14, 2018 issued in Application No. SG 10201600099V.

(56) References Cited

OTHER PUBLICATIONS

Chinese First Office Action dated Jun. 26, 2018 issued in Application No. CN 201610255293.7.
Singapore Search Report and Written Opinion dated Jul. 9, 2018 issued in Application No. SG 10201603092R.
Chinese First Office Action dated Mar. 30, 2018 issued in Application No. CN 201610248296.8.
Chinese Second Office Action dated Dec. 27, 2018 issued in Application No. CN 201610248296.8.
Singapore Search Report and Written Opinion dated Jun. 28, 2018 issued in SG 10201603090V.
Happich, J., et al., (2018) "Atomic layer etching yields 2.5nm wide FinFETs," eeNews Europe, pp. 1-4. [retrieved on Dec. 12, 2018] <URL:http://www.eenewseurope.com/news/atomic-layer-etching-yields-25nm-wide-finfets#>.
Kanarik et al. (2017) "Predicting synergy in atomic layer etching," J. Vac. Sci. Technol. A,35(5):05C302-1 through 05C302-7.
U.S. Office Action dated Jan. 2, 2019 issued in U.S. Appl. No. 15/952,834.
U.S. Office Action dated Apr. 19, 2018 issued in U.S. Appl. No. 15/494,245.
U.S. Notice of Allowance dated Dec. 13, 2018 issued in U.S Appl. No. 15/494,245.
U.S. Appl. No. 16/220,583, filed Dec. 14, 2018, Kanarik et al.
U.S. Notice of Allowance dated Apr. 4, 2019 issued in U.S. Appl. No. 15/952,834.
U.S. Office Action dated Jan. 14, 2019 issued in U.S. Appl. No. 15/799,675.
U.S. Final Office Action dated Jul. 25, 2019 issued in U.S. Appl. No. 15/799,675.
International Search Report and Written Opinion dated Feb. 25, 2019 issued in Application No. PCT/US2018/055065.
Kanarik et al. (Aug. 2018) "Atomic Layer Etching: Rethinking the Art of Etch" The Journal of Physical Chemistry Letters, vol. 9, pp. 4814-4821. <doi:10.1021/acs.jpclett.8b00997>.
U.S. Office Action dated May 31, 2019 issued in U.S. Appl. No. 16/220,583.
U.S. Notice of Allowance dated Mar. 22, 2019 issued in U.S. Appl. No. 15/719,497.
U.S. Final Office Action dated Jun. 19, 2019 issued in U.S. Appl. No. 15/581,951.
Chinese Third Office Action dated Mar. 4, 2019 issued in Application No. CN 201610017911.4.
Taiwan First Office Action dated Jul. 19, 2019 issued in Application No. TW 105100640.
Chinese Second Office Action dated Feb. 3, 2019 issued in Application No. CN 201610255293.7.
U.S. Appl. No. 16/361,083, filed Mar. 21, 2019, Tan et al.
U.S. Appl. No. 16/449,141, filed Jun. 21, 2019, Tan et al.
U.S. Notice of Allowance dated Aug. 21, 2019 issued in U.S. Appl. No. 16/220,583.
U.S. Office Action dated Sep. 19, 2019 issued in U.S. Appl. No. 15/824,987.
U.S. Notice of Allowance dated Oct. 3, 2019 issued in U.S. Appl. No. 15/581,951.
U.S. Office Action dated Dec. 30, 2019 issued in U.S. Appl. No. 15/955,099.
Chinese Fourth Office Action dated Sep. 29, 2019 issued in Application No. CN 201610017911.4.
Chinese First Office Action dated Aug. 5, 2019 issued in Application No. CN 201810642746.0.
Japanese First Office Action dated Jan. 28, 2020 issued in Application No. JP 2016-002141.
Taiwan Notice of Allowance dated Dec. 27, 2019 issued in Application No. TW 105112529.
Chinese First Office Action dated Nov. 4, 2019 issued in CN 201710064610.1.
Carver et al., "Atomic Layer Etching: An Industry Perspective" ECS Journal of Solid State Science and Technology, vol. 4, No. 6, 2015, pp. N5005-N5009.
Kanarik et al. (Nov. 2016) "Tech Brief: All About ALE" [webpage] pp. 1-3. <URL:https://blog.lamresearch.com/tech-brief-all-about-ale/>.
U.S. Office Action dated Dec. 12, 2019 issued in Application No. 15/799,675.
Taiwan First Office Action dated Sep. 19, 2019 issued in Application No. TW 105128324.
Taiwan Notice of Allowance dated Feb. 5, 2020 issued in Application No. TW 105128324.
U.S. Appl. No. 16/713,557, filed Dec. 13, 2019, Reddy et al.
U.S. Appl. No. 16/691,546, filed Nov. 21, 2019, Kanarik et al.
Chinese Second Office Action dated May 26, 2020 issued in Application No. CN 201810642746.0.
Japanese First Office Action dated Jun. 2, 2020 issued in Application No. JP 2016-082061.
U.S. Final Office Action dated Apr. 1, 2020 issued in U.S. Appl. No. 15/799,675.
U.S. Notice of Allowance dated May 11, 2020 issued in U.S. Appl. No. 15/824,987.

* cited by examiner

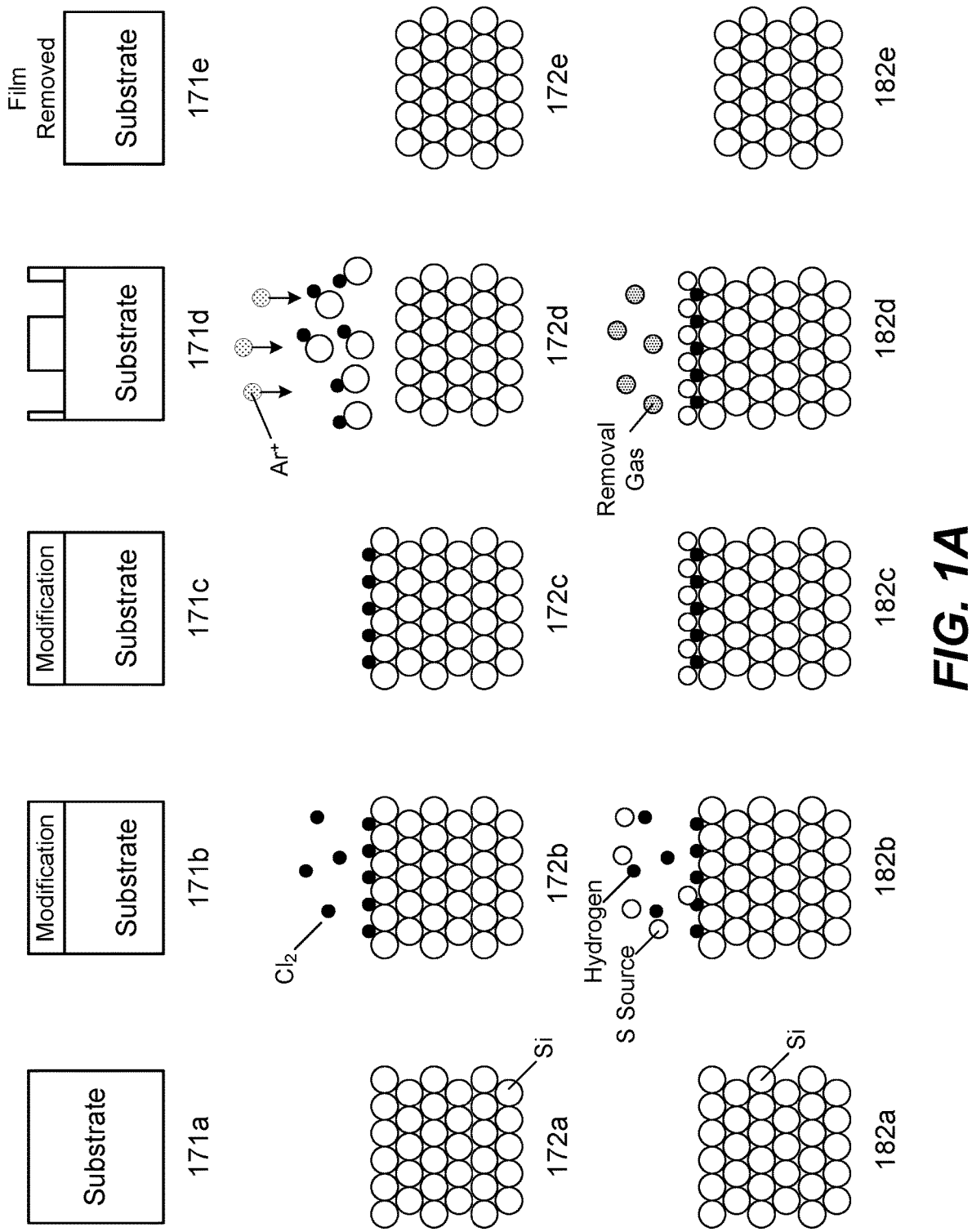

ATOMIC LAYER ETCHING 3D STRUCTURES: SI AND SIGE AND GE SMOOTHNESS ON HORIZONTAL AND VERTICAL SURFACES

CROSS-REFERENCE TO RELATED APPLICATION

This application claims benefit of U.S. Provisional Patent Application No. 62/291,392, filed Feb. 4, 2016, and titled "ATOMIC LAYER ETCHING 3D STRUCTURES: SI AND SIGE AND GE SMOOTHNESS ON HORIZONTAL AND VERTICAL SURFACES," which is incorporated by reference herein in its entirety and for all purposes.

BACKGROUND

Semiconductor fabrication processes often involve etching of semiconductor material in high aspect ratio features. As devices shrink, some techniques for etching semiconductor material may cause undesirable lateral etching and material damage that can affect device performance and subsequent fabrication processes.

SUMMARY

Provided herein are methods and apparatus for processing semiconductor substrates. One aspect involves a method of etching a substrate, the method including: (a) etching a substrate by performing n cycles of: (i) exposing the substrate to a reactive gas to modify a surface of the substrate without etching the surface of the substrate and (ii) after exposing the substrate to the first etching gas, exposing the modified surface of the substrate to a removal species to remove at least some of the modified surface; and (b) periodically exposing the substrate to an oxygen-containing plasma to passivate the surface of the substrate, whereby n is an integer between and including 1 and 100.

In various embodiments, the reactive gas is a halogen-containing gas, which may be any of chlorine, boron chloride, hydrogen chloride, hydrogen bromide, bromine, nitrogen fluoride, and fluorine; and whereby the surface of the substrate is modified by chemisorption.

In some embodiments, the reactive gas includes a sulfur-containing gas and the surface of the substrate is modified by deposition. In some embodiments, the sulfur-containing gas is any of sulfur hexafluoride, sulfur dioxide, and hydrogen sulfide. In some embodiments, the reactive gas further includes a second reactive gas such as hydrogen or a halogen-containing gas. The halogen-containing gas may be any of nitrogen trifluoride, fluorocarbons, and fluorine. Example fluorocarbons include carbon tetrafluoride ($CF_4$), hexafluoro-2-butyne ($C_4F_6$), fluoromethane ($CH_3F$), and combinations thereof.

In various embodiments, the removal species is generated by introducing an activating gas and igniting a plasma using a plasma power between about 50 W and about 1000 W.

In various embodiments, x is the number of cycles for which (i) and (ii) are repeated using a halogen-containing gas as the reactive gas and y is the number of cycles for which (i) and (ii) are repeated using a sulfur-containing gas, and whereby the ratio of x to y is between 2:1 and 20:1.

In various embodiments, a bias is applied during exposure to the removal species to facilitate removal of the at least some of the modified surface.

In various embodiments, the bias power is less than about 50 V. In some embodiments, a bias is not applied during exposure to the removal species and the bias power is 0 V. In some embodiments, the bias is applied continuously, and whereby the bias power is between about 40V and about 100V.

In some embodiments, the bias is pulsed for a duty cycle between about 5% and about 40% and the bias power is between about 300V and about 1000V.

In some embodiments, the bias is pulsed for a duty cycle of about 50%, and the bias power is between about 100V and about 300V.

In various embodiments, the oxygen-containing plasma is generated by introducing an oxygen-containing gas selected from the group consisting of oxygen, carbon dioxide, and sulfur dioxide; and igniting a plasma.

In various embodiments, periodically exposing the substrate to the oxygen-containing plasma to passivate the surface of the substrate includes depositing an oxide layer on the surface of the substrate by atomic layer deposition.

In some embodiments, etching the substrate by performing the n cycles and periodically exposing the substrate to the oxygen-containing plasma is performed without breaking vacuum.

In various embodiments, periodically exposing the substrate to the oxygen-containing plasma to passivate the surface of the substrate includes depositing an oxide layer on the surface of the substrate by plasma-enhanced chemical vapor deposition.

Another aspect involves a method of etching a substrate, the method including: (a) exposing a substrate to a first etching gas to modify a first surface of the substrate by chemisorption; (b) after exposing the substrate to the first etching gas, exposing the substrate to a removal gas to remove at least some of the first modified surface, or (c) exposing the substrate to a second etching gas to modify a second surface of the substrate by deposition; (d) after exposing the substrate to the second etching gas, exposing the substrate to the removal gas to remove at least some of the second modified surface; and (e) repeating (a)-(d) and periodically exposing the substrate to an oxygen-containing plasma to passivate surfaces of the substrate.

In various embodiments, (a) and (b) are repeated for x cycles, (c) and (d) are repeated for y cycles, whereby repeating (a)-(d) includes performing n number of repetitions of repeating (a) and (b) for x cycles and repeating (c) and (d) for y cycles, and the ratio of x/y is between 2:1 and 20:1; x and y are integers greater than or equal to 1; and n is an integer between and including 2 and 100. In one example, the ratio of x toy is 3:1 and n is 1.

In various embodiments, periodically exposing the substrate to the oxygen-containing plasma forms oxide on sidewalls of the substrate to a thickness less than about 5 nm.

In various embodiments, a bias is applied during exposure to the removal species to facilitate removal of the at least some of the first modified surface.

In various embodiments, a bias is applied during exposure to the removal species to facilitate removal of the at least some of the second modified surface.

In various embodiments, the second etching gas includes two or more gases.

In various embodiments, the second etching gas includes a sulfur-containing halogen gas and hydrogen. Example sulfur-containing gases include sulfur hexafluoride, sulfur dioxide, and hydrogen sulfide.

In various embodiments, the oxygen-containing plasma is generated by introducing oxygen-containing gas selected from the group consisting of oxygen, carbon dioxide, and sulfur dioxide; and igniting a plasma.

In various embodiments, exposing the substrate to the oxygen-containing plasma to passivate surfaces of the substrate includes depositing an oxide layer on the surfaces of the substrate by plasma-enhanced chemical vapor deposition.

In various embodiments, exposing the substrate to the oxygen-containing plasma to passivate surfaces of the substrate includes depositing an oxide layer on the surfaces of the substrate by atomic layer deposition.

In various embodiments, repeating (a)-(e) is performed without breaking vacuum.

In various embodiments, the substrate is patterned with features having a critical dimension less than about 10 nm.

In various embodiments, the method also includes purging a chamber housing the substrate after exposing the substrate to the etching species.

In various embodiments, the method also includes purging a chamber housing the substrate after exposing the substrate to the removal species.

In various embodiments, the method also includes purging a chamber housing the substrate after exposing the substrate to the second etching gas.

Another aspect involves an apparatus for processing substrates, the apparatus including: (a) one or more process chambers, each process chamber including a chuck; (b) one or more gas inlets into the process chambers and associated flow-control hardware; (c) a plasma generator for generating a plasma in at least one of the one or more process chambers; and (d) a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware to: (i) introduce a reactive gas to a first process chamber of the one or more process chambers to modify a first surface of a substrate held by the chuck in the first process chamber; (ii) introduce a removal gas to the first process chamber and ignite a plasma to generate an activated species for removing at least some of the first modified surface of the substrate; and (iii) periodically introduce an oxygen-containing gas and ignite a second plasma to passivate surfaces of the substrate.

In various embodiments, the reactive gas is chlorine and the first surface of the substrate is modified by chemisorption.

In various embodiments, the reactive gas includes a sulfur-containing gas and hydrogen and the first surface of the substrate is modified by deposition. In some embodiments, the memory further stores computer-executable instructions for repeating (i) and (ii) for x and y number of cycles, where the reactive gas is chlorine during the x cycles, and where the reactive gas includes sulfur-containing gas and hydrogen during the y cycles.

In various embodiments, the memory further stores computer-executable instructions for moving the substrate to a second process chamber of the apparatus to introduce the oxygen-containing gas and ignite the second plasma to passivate the surfaces of the substrate.

In various embodiments, (i)-(iii) are performed without breaking vacuum.

Another aspect involves a method of etching semiconductor material on a substrate, the method including: (a) exposing the substrate to chlorine to modify a first surface of the substrate by chemisorption; (b) after exposing the substrate to the chlorine, exposing the substrate to a removal species and applying a bias to remove at least some of the first modified surface; (c) exposing the substrate to sulfur hexafluoride and hydrogen to modify a second surface of the substrate by deposition; (d) after exposing the substrate to the sulfur hexafluoride and hydrogen, exposing the substrate to the removal species to remove at least some of the second modified surface; and (e) repeating (a)-(d) and periodically exposing the substrate to an oxygen-containing plasma to passivate surfaces of the substrate.

These and other aspects are described further below with reference to the drawings.

BRIEF DESCRIPTION OF THE DRAWINGS

FIG. 1A includes schematic illustrations of examples of atomic layer etch mechanisms.

DETAILED DESCRIPTION

Figure 1B:
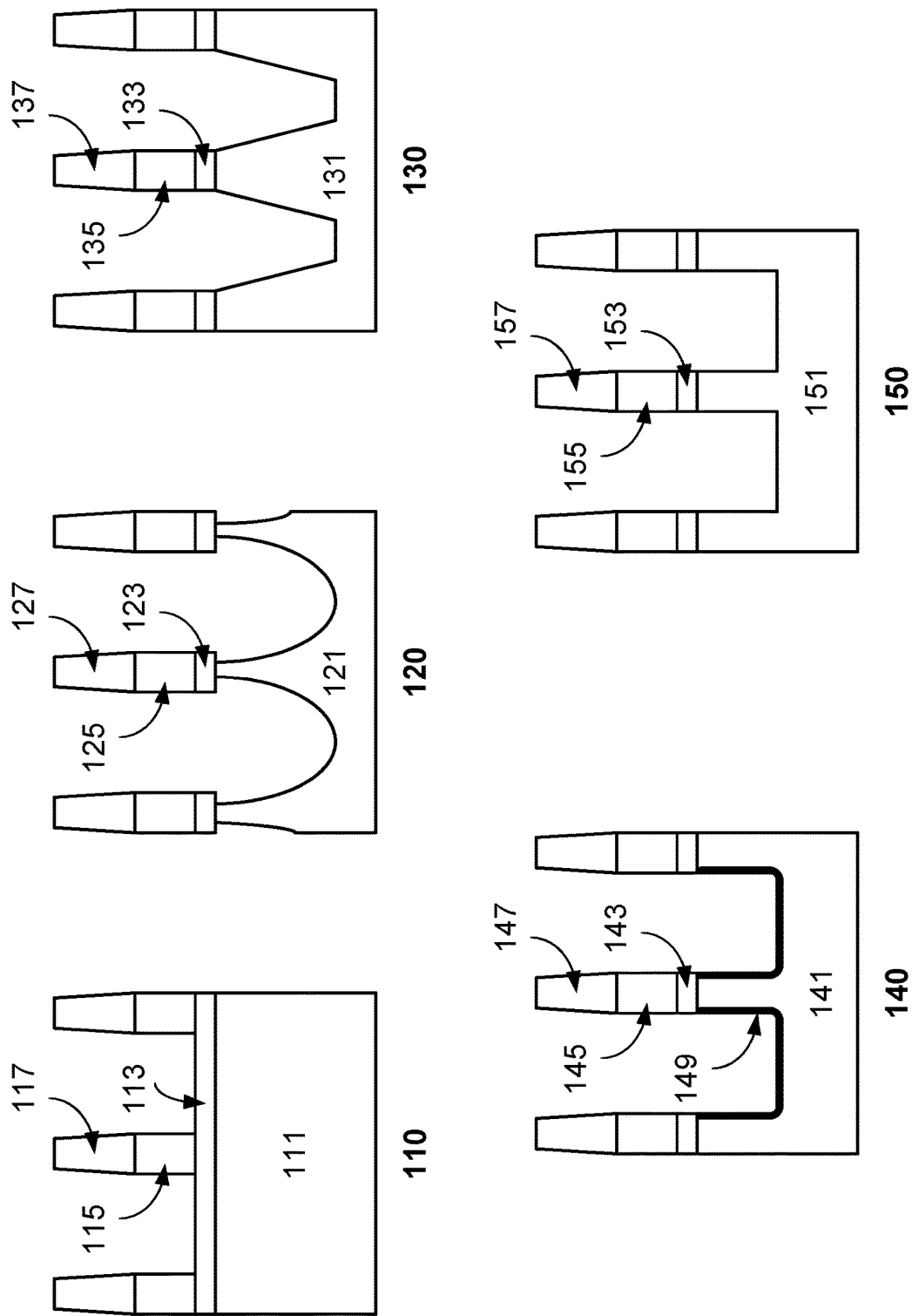
FIG. 1B includes schematic illustrations of substrates before and after ALE-I, ALE-II, and ALE-I and ALE-II with oxide passivation.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor device fabrication processes often involve etching processes for forming various structures on a semiconductor substrate. Conventional plasma etch processes often involve continuous etching of material, but are particularly prone to transport-limitations and result in roughness and damage on the etched surface. Conventional plasma etch processes coupled with pulsing of a bias during etch may improve etch performance. Cycling processes involving etch processes coupled with operations to protect sidewalls of the material to be etched (e.g., target material) may be used to obtain a desired etch profile while protecting the sidewalls, and offer further improvement by separating out the process steps.

Atomic layer etching (ALE) is one approach for atomic scale control of etching behavior. ALE is a type of cycling process involving a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S.

Pat. No. 8,808,561, issued on Aug. 19, 2014, which are herein incorporated by reference for purposes of describing example atomic layer etch and etching techniques. In various embodiments, ALE may be performed with plasma, or may be performed thermally.

ALE may be done by a surface modification operation (i.e. reaction of reactive chemistry on a substrate surface) followed by a removal operation (i.e. ion assisted etching using inert, non-reactive ions). Such operations may be repeated for a certain number of cycles. During ALE, the reactive chemistry and the inert ions are delivered separately to the substrate.

The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. Modification may be performed by using a chemisorption mechanism, deposition mechanism, top layer conversion mechanism, or extraction mechanism. ALE performed using a chemisorption mechanism may be described herein as an "ALE-I" operation. ALE performed using a deposition mechanism may be described herein as an "ALE-II" operation. An ALE cycle may include certain ancillary operations such as sweeping one of the reactants or byproducts. Generally, a cycle contains one instance of a unique sequence of operations. As an example, an ALE cycle may include the following operations: (i) delivery of one or more reactant gases, (ii) purging of the reactant gas from the chamber, (iii) delivery of a removal gas and an optional plasma, and (iv) purging of the chamber. Further description and examples of ALE-I are described in U.S. patent application Ser. No. 14/696,254, filed on Apr. 24, 2015 and titled "INTEGRATING ATOMIC SCALE PROCESSES: ALD (ATOMIC LAYER DEPOSITION) AND ALE (ATOMIC LAYER ETCH)," which is incorporated herein by reference for purposes of describing atomic layer etch processes.

FIG. 1A shows example schematic illustrations of ALE cycles based on various mechanisms. Diagrams 171a-171e show a generic ALE cycle. In 171a, the substrate is provided. In 171b, the surface of the substrate is modified. The surface of the substrate may be modified without etching the surface of the substrate. The modification operation forms a thin, reactive surface layer with a thickness that is more easily removed than the un-modified material in the subsequent removal operation. In 171c, the next step is prepared which may involve purging excess reactive chemistry used to modify the surface of the substrate. In 171d, the modified layer is being etched. In 171e, the modified layer is removed.

Diagrams 172a-172e show an example of an ALE-I cycle for etching a silicon film. In 172a, a silicon substrate is provided, which includes many silicon atoms. In 172b, reactant gas chlorine is introduced to the substrate to modify the surface of the substrate by chemisorption. The schematic in 172b shows that some chlorine is adsorbed onto the surface of the substrate as an example. Although chlorine is depicted in FIG. 1B, any chlorine-containing compound or suitable reactant may be used. In 172c, the reactant gas chlorine is purged from the chamber. In 172d, a removal gas argon is introduced with a directional plasma as indicated by the Ar+ plasma species and arrows, and ion bombardment is performed to remove the modified surface of the substrate. During this operation, a bias is applied to the substrate to attract ions toward it. In 172e, the chamber is purged and the byproducts are removed.

Diagrams 182a-182e show an example of an ALE-II cycle for etching a silicon film. In 182a, a silicon substrate is provided, which includes many silicon atoms. In 182b, a fluorine source, such as sulfur hexafluoride, is introduced to the substrate to modify the surface of the substrate by adsorption of sulfur fluoride ($SF_x$) species. The schematic shown in 182b shows that some reacted sulfur fluoride is deposited onto the surface of the substrate. Other generic fluorine source such as nitrogen trifluoride ($NF_3$) and/or carbon fluoride ($CF_x$, $CHF_x$) can be used and sulfur hexafluoride is provided as an example. In 182c, the sulfur fluoride source is purged from the chamber. In 182d, a removal gas is introduced to remove the modified surface of the substrate. In 182e, the chamber is purged and the byproducts are removed.

Performing only ALE-I to etch semiconductor material such as silicon, germanium, or silicon germanium using cycles involving only modification by a chemisorption mechanism may result in lateral etching or undercutting of the substrate. This may be the case in particular for germanium and germanium-containing compounds, which has a lower Ge—Ge bond energy (2.8 eV) than silicon (3.4 eV). Additionally, for a chlorine-containing modification chemistry by chemisorption, the sublimation temperature of Ge—Cl is about 300° C., which is substantially lower than the sublimation temperature of Si—$Cl_2$ of 650° C., which renders germanium a softer material that is more susceptible to etching quickly and thereby being vulnerable to possible undesirable lateral etching. Lateral etching may also be affected by ion angle distribution, spontaneous radial etching, and/or photon induced etching, etc.

Provided herein are methods of etching substrates using a combination of ALE with modification by a chemisorption mechanism (ALE-I), ALE with modification by a deposition mechanism (ALE-II), and an oxide passivation operation. In some embodiments, methods involve etching substrates using ALE-I and an oxide passivation operation without using ALE-II. In some embodiments, methods involve etching substrates using ALE-II and an oxide passivation operation without using ALE-I. In some embodiments, methods involve etching substrates using all of ALE-I, ALE-II, and oxide passivation. In some features and for some materials, ALE-I may be performed with oxide passivation to obtain vertical sidewalls and a smooth etch profile. Embodiments herein may be used to etch semiconductor material, such as silicon, silicon germanium, and germanium, and any soft material, such as photoresist. For etching soft, non-semiconductor material, chemistries used for modification in ALE-I and ALE-II may be different from those disclosed herein. In various embodiments, process conditions such as number of cycles of ALE-I, number of cycles of ALE-II, deposition chemistry during ALE-II, and oxide passivation frequency may depend on the germanium content in the material to be etched.

Disclosed embodiments may be performed using a low bias or higher bias pulsing to allow directional etching. The bias may be used during removal operations of ALE-I, ALE-II, or both. Example bias powers include bias power less than about 100 $V_b$, such as about 50 $V_b$ or bias pulsing such as 200 Vb. In some embodiments, ions may be the driving force used to remove a modified layer to achieve an atomically smooth etch front. In some embodiments, an atomically smooth surface may have a roughness less than about 5 Å.

The modification step can involve a chemisorption or deposition mechanism as described herein. ALE-I uses chemisorption modification, which may cause some lateral etch component during modification. In the following ALE-I cycles, the surface of the sidewalls at or near the top of the features may be exposed to more cycles of lateral attack. As a result, the accumulated lateral etching defines a profile having a gradually shrinking critical dimension at or near the top of the feature which results in undercutting. FIG. 1B shows a germanium substrate before etching (110), and a germanium substrate with tapered etch caused by performing ALE-II alone (130), and a germanium substrate with lateral etch caused by performing ALE-I alone (120). Substrate 110 includes semiconductor material 111 under an underlayer 113, with a patterned fin structure including materials 115 and 117 overlying the underlayer 113. Substrate 120 shows the resulting lateral etching effect caused by performing ALE-I to etch semiconductor material 111 of substrate 110 such that undercutting and lateral etching results in etched semiconductor material 121 after etching underlayer 113 to form etched underlayer 123. The overlying fin structure including materials 125 and 127 remains unetched. Substrate 130 shows the resulting etching effect caused by performing ALE-II to etch semiconductor material 111 of substrate 110 to form etched semiconductor material 131, with overlying etched underlayer 133 and fin structure having materials 135 and 137. ALE-II uses deposition modification and yields little to no lateral etch during modification by forming a passivation layer. The following ALE-II cycles may experience critical dimension expansion due to volume expansion on sidewall surfaces. Thus, instead of resulting in a smaller critical dimension, ALE-II alone may result in a tapered sidewall profile due to sidewall surface passivation. Combining ALE-I and ALE-II as described in disclosed embodiments allows for tailoring of the etch profile. Substrate 140 includes overlying fin structure having materials 145 and 147 and an etched semiconductor material 141 with oxide passivation 149 after etching underlayer 143. Substrate 150 shows fin structure having materials 155 and 157 and an etched underlayer 153 with an etched semiconductor material 151 after performing a combination of ALE-I, ALE-II, and oxide passivation. As shown in the schematic, when the ALE-I, ALE-II, and oxide passivation are combined, the etch process may be controlled to achieve vertical sidewalls.

Certain disclosed embodiments have the capability to define a vertical surface in features such that the vertical surface may be substantially parallel with etch direction, thereby achieving an atomically smooth surface. In various embodiments, certain disclosed embodiments are also capable of defining a horizontal etch surface with atomic level smoothness without causing a loading effect. Certain disclosed embodiments improve the surface of etch front, result in etching vertical sidewalls, and improves the etch profile of the substrate.

Figure 2:
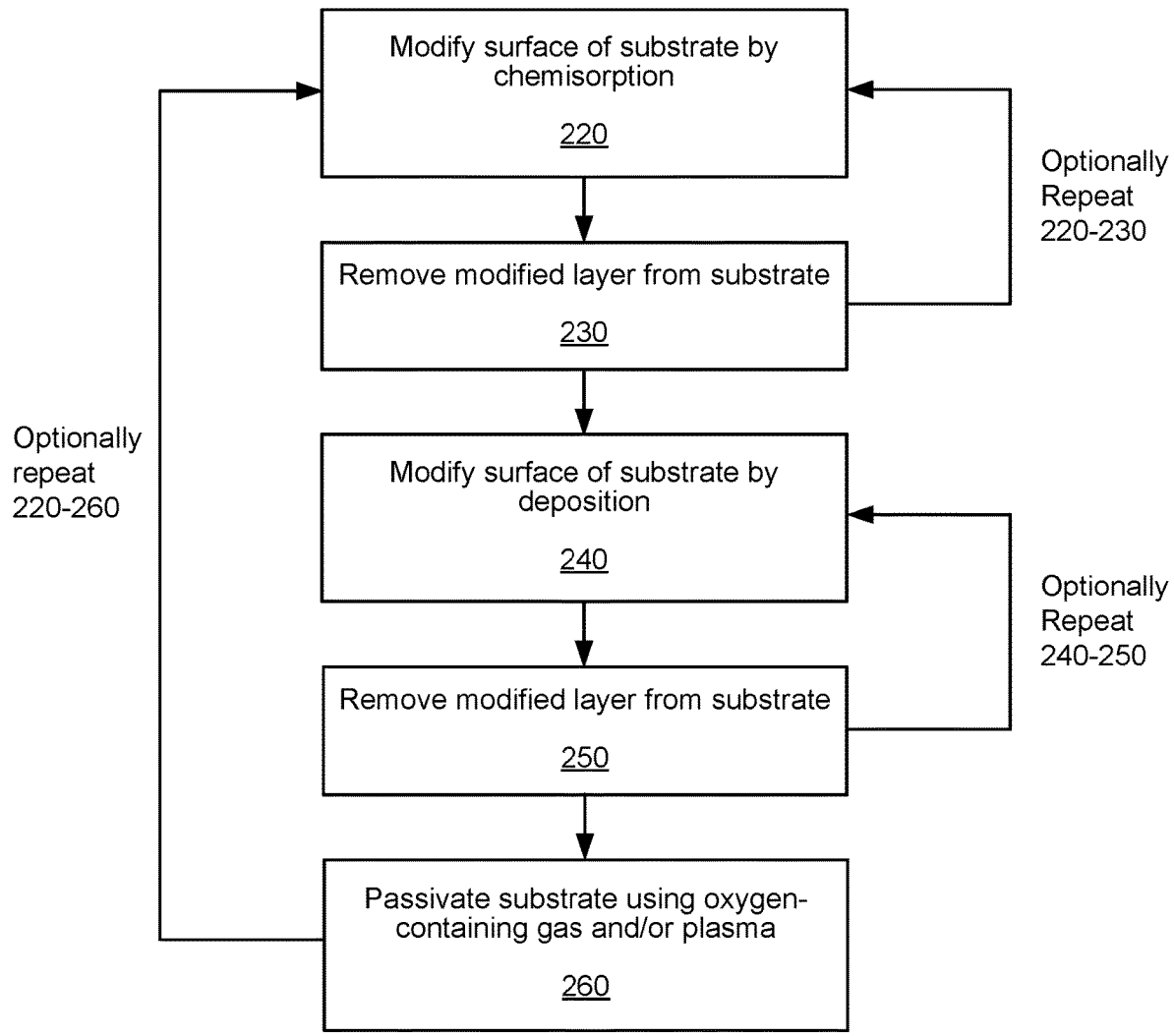
FIG. 2 is a process flow diagram depicting operations for a method in accordance with certain disclosed embodiments.

FIG. 2 shows a process flow diagram depicting operations performed in accordance with certain disclosed embodiments. Operations 220 and 230 of FIG. 2 may constitute a single ALE-I cycle. ALE-I may be performed using a chlorine-containing chemistry during modification by chemisorption operations (operation 220) and an inert gas chemistry such as argon during removal operations (operation 230). Each of these operations are described in further detail below.

In operation 220, a surface of a substrate is modified by a chemisorption mechanism. The substrate surface may include semiconductor materials, such as silicon, germanium, silicon germanium, or combinations thereof.

Etching chemistry is introduced into the chamber in operation 220 of FIG. 1A. The etching chemistry may be referred to herein as etching gas or reactive gas. In some embodiments, etching chemistry may include a halogen-containing gas or plasma. For example, in some embodiments, operation 220 may include exposing the substrate to chlorine gas ($Cl_2$) to chemisorb chlorine species on the surface of the material to be etched. Chlorine is used as an example etchant species in disclosed embodiments, but it will be understood that in some embodiments, a different etching gas is introduced into the chamber. The etching gas may be selected depending on the type and chemistry of the substrate to be etched. In various embodiments, the reactive gas may be any of one or more of the following gases: chlorine, boron chloride, hydrogen chloride, hydrogen bromide, bromine, nitrogen fluoride, and fluorine. It will be understood that while a list of example reactive gases are provided herein, disclosed embodiments are not limited by this list. In some embodiments, a plasma may be ignited and chlorine reacts with the substrate for the etching process. The species generated from a chlorine plasma can be generated directly by forming a plasma in the process chamber housing the substrate or they can be generated remotely in a process chamber that does not house the substrate, and can be supplied into the process chamber housing the substrate. In various embodiments, the plasma may be an inductively coupled plasma or a capacitively coupled plasma. An inductively coupled plasma may be set at a plasma between about 50 W and about 2000 W. In some embodiments, a bias may be applied between about 0V and about 500V. In some embodiments, chlorine plasma may react with the substrate or may be adsorbed onto the surface of the substrate.

As described herein, in operations where materials are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters.

In some embodiments, a plasma is not used and chlorine may be introduced thermally into the chamber. In various embodiments, chlorine is introduced into the chamber in a gaseous form and may be optionally accompanied by a carrier gas such as nitrogen, argon, neon, helium, or combinations thereof.

In some embodiments, a carrier gas, such as nitrogen, argon, neon, helium, or combinations thereof, is continuously flowed during operation 220. In some embodiments, a carrier gas is only used during removal in operation 230 as described further below. The carrier gas may be used as a purge gas in some operations as described below. In some embodiments, another reactant gas, such as oxygen, is used during operation 220 to remove a modified layer. In some embodiments, a carrier gas is not flowed during removal.

In various embodiments, the chamber housing the substrate may be purged (not shown) after performing operation 220. In this purge operation, non-surface-bound active chlorine species may be removed from the process chamber. This can be done by purging and/or evacuating the process chamber to remove the active species, without removing the adsorbed layer. The species generated in a chlorine plasma can be removed by simply stopping the plasma and allowing the remaining species decay, optionally combined with purging and/or evacuation of the chamber. Purging can be done using any inert gas such as $N_2$, Ar, Ne, He and combinations thereof. And/or a pumping step can be used to evacuate the chamber.

During operation 230, in a removal operation, the substrate may be exposed to an energy source (e.g. activating or sputtering gas or chemically reactive species that induces removal), such as argon or helium, to etch the substrate by directional sputtering. In some embodiments, the removal operation may be performed by ion bombardment. During removal, a bias may be optionally turned on to facilitate directional sputtering. In some embodiments, ALE may be isotropic. A gas may be ignited to form a plasma thereby form an activated gas, such as $Ar^+$. In various embodiments the activated gas may include charged species. The plasma may be an in situ or remote plasma. The plasma may be generated using a power between about 10 W and about 1500 W or between about 50 W and about 1000 W. The flow rate of the inert gas may be about 50 sccm to about 600 sccm. In some embodiments, the bias is pulsed. The bias may be pulsed using a duty cycle between about 5% and about 50%, such as between about 5% and about 40%. In some embodiments, the bias is pulsed using a duty cycle of 50%.

The amount of activated gas may be controlled such as to etch only a targeted amount of material. In various embodiments, the pressure of the chamber may vary between the modification and removal operations. The pressure of the gas may depend on the size of the chamber, the flow rate of the gas, the temperature of the reactor, the type of substrate, and the size of substrate to be etched. If the bias is turned on during removal, the bias may be set to a bias power between 20 V and 65 V for etching germanium using Ar+ as an activating gas. In some embodiments, the bias may be set to a bias power of about 40-70 V for etching silicon using Ar+ as an activating gas. For a continuous bias, the bias power may be between about 40V and about 100V. In various embodiments, the bias power may be less than about 50V. In some embodiments, the bias power is 0V.

For a pulsed bias having a duty cycle of about 50%, the bias power may be between about 100V and about 300V. For a pulsed bias having a duty cycle between about 5% and about 40%, the bias power may be between about 300V and about 1000V.

In some embodiments, the chamber may be optionally purged after operation 230. Purge processes and chemistries may be any of those used for a purge after a modification operation.

Performing operations 220 and 230 may remove at least a portion of the modified surface of the substrate. Operations 220 and 230 may be optionally repeated for x cycles of ALE-I. As used herein, x may be an integer greater than or equal to 1. In various embodiments, x may be between 1 and 30, or between 1 and 20.

In operation 240, the surface of the substrate is modified by a deposition mechanism (ALE-II). It will be understood that in some embodiments, operations 220 and 230 are performed prior to operations 240 and 250, while in some embodiments, operations 240 and 250 are performed prior to operations 220 and 230. That is, in some embodiments ALE-I is performed prior to ALE-II, and in some embodiments ALE-II is performed prior to ALE-I.

In some embodiments, ALE-II may be performed using a sulfur-containing deposition chemistry with a second reactant during modification by deposition operations and an inert gas chemistry such as argon during removal operations.

In various embodiments, the sulfur-containing deposition chemistry includes a sulfur-containing halogen gas, such as sulfur hexafluoride. In some embodiments, the fluorine containing deposition chemistry may include halogen-containing sulfur-containing chemistry. Sulfur-containing chemistries may be used to facilitate passivation by sulfur on the sidewalls of the material to be etched. Example sulfur-containing deposition chemistries include sulfur hexafluoride ($SF_6$), hydrogen sulfide ($H_2S$), and sulfur dioxide ($SO_2$). In some embodiments, the reactive gas is flowed with a second reactive gas, such as hydrogen and a halogen-containing gas, such as nitrogen trifluoride, fluorine, and a mixture of nitrogen trifluoride and fluorine. In one example, in some embodiments, ALE-II may be performed by reacting sulfur hexafluoride ($SF_6$) with hydrogen ($H_2$) to deposit a sulfur-containing fluorine-containing chemistry on the surface of the material to be etched. In some embodiments, the sulfur-containing deposition chemistry may include a fluorocarbon such as carbon tetrafluoride ($CF_4$), hexafluoro-2-butyne ($C_4F_6$), fluoromethane ($CH_3F$), or other $CHF_x$ gases or similar compounds and combinations thereof.

In various embodiments, the chamber housing the substrate may be purged between performing operation 240 and 250. Purging operations may be performed using any of the purge chemistries and process conditions described above with respect to operation 230.

In operation 250, the layer modified by deposition is removed, which may be performed by introducing an activating gas, such as that described above with respect to operation 220. Any of the removal operation process conditions described above with respect to operation 220 may be used in operation 250. In various embodiments, the chamber may be purged after performing operation 250. Purging operations may be performed using any of the purge chemistries and process conditions described above with respect to operation 230.

Operations 240 and 250 may be optionally repeated for y cycles, where y is an integer greater than or equal to 1 and where x is the number of cycles for repeating operations 220 and 230. The ratio of x to y may be between 2:1 and 20:1, such as 2:1, 3:1, 5:1, 10:1, and 20:1. In some embodiments, the ratio of x to y is 3:1. The ratio of x to y is selected to produce a vertical profile.

In operation 260, the substrate is passivated using an oxygen-containing gas and/or oxygen-containing plasma. During oxide passivation, oxide may form on the sidewalls, thereby protecting them from lateral etching by ALE-I. In various embodiments, oxide formed on the sidewalls may be less than about 5 nm, such as less than about 1 nm. In some embodiments, oxide formed at or near the top of features for high aspect ratio features such as fin and gate structures may be thicker than oxide formed at or near the bottom of the high aspect ratio features. In some embodiments, oxide passivation forms a thin oxide layer by exposing the substrate to the oxygen-containing reactant continuously, such as using chemical vapor deposition such as a mixture of sulfur chloride and oxygen ($SCl_x/O_2$) or oxygen ($O_2$) gas itself. In some embodiments, the thin oxide layer is deposited by atomic layer deposition. In various embodiments, a plasma may be generated during oxide passivation to expose the substrate to oxygen-containing plasma such as oxygen ($O_2$), carbon dioxide ($CO_2$), and sulfur dioxide ($SO_2$).

In some embodiments, after performing operations 220 and 230, operation 260 is performed without performing operations 240 and 250. That is, in some embodiments, ALE-I is performed and oxide passivation is used without performing ALE-II. In some embodiments, only operations

240, 250, and 260 are performed such that ALE-II is performed with oxide passivation without performing ALE-I. In some embodiments, operations 220-250 are repeated in n cycles after performing operation 260. In some embodiments, all of operations 220, 230, 240, 250, and 260 are performed in a combined ALE-I, ALE-II, and oxide passivation process.

Combining ALE-I and ALE-II and in some embodiments, oxide passivation, results in atomic smoothness for both horizontal and vertical surface engineering. Performing a complete cycle of ALE-I, ALE-II, and oxide passivation may be represented by the following equation:

$$n(x+y)+z \qquad \text{Eqn. 1}$$

where n is the number of repetitions of x cycles of ALE-I (where one cycle of ALE-I includes modification by chemisorption, optional purge, removal, and a second optional purge) and y cycles of ALE-II (where one cycle of ALE-II includes modification by deposition, optional purge, removal, and a second optional purge) and oxide passivation is performed z times for every n repetitions of x cycles of ALE-I and y cycles of ALE-II. As described herein, n, x, y, and z may be integers greater than or equal to 1. The ratio of x/y provides a tool to etch substrates having vertical sidewall surfaces. Tuning the x/y ratio balances the effect of lateral etching from ALE-I with the tapered etch of ALE-II. In some embodiments, the ratio of x/y may be tuned to etch features having an expanded critical dimension due to passivation. Note that in some embodiments, the a complete cycle of ALE-I, ALE-II, and oxide passivation may be repeated for multiple cycles. For example, after performing operation 260 in FIG. 2, operations 220-250 may be optionally repeated. In some embodiments, disclosed embodiments include repeating operations 220-260 in multiple cycles.

One example of a complete cycle of ALE-I, ALE-II, and oxide passivation may be where n=3, x=3, y=1, and z=1. In this example, if ALE-I and ALE-II included purge operations, the following operations may be performed:
(1) Modification by chemisorption
(2) Purge
(3) Removal
(4) Purge
(5) Modification by chemisorption
(6) Purge
(7) Removal
(8) Purge
(9) Modification by chemisorption
(10) Purge
(11) Removal
(12) Purge
(13) Modification by Deposition
(14) Purge
(15) Removal
(16) Purge
(17) Repeat 1-16 three times
(18) Oxide passivation In various embodiments, oxide passivation may be performed every 1 to every 200 cycles of a combination of ALE-I and ALE-II (e.g., z=1 where n=1 to 100). For example, oxide passivation may be performed every 3 cycles of a combination of ALE-I and ALE-II (z=1 and n=3). Such an embodiment may be represented by Equation 2 below for x cycles of ALE-I and y cycles of ALE-II.

$$3(x+y)+1 \text{ oxide passivation} \qquad \text{Eqn. 2}$$

Plasma may be generated in both the modification and the removal operations of ALE-I, ALE-II, or both. In some embodiments, oxide passivation may be performed by exposing the substrate to an oxygen-containing gas such as carbon dioxide ($CO_2$), sulfur dioxide ($SO_2$), and, oxygen ($O_2$), or exposing the substrate to air. Disclosed embodiments may be suitable for etching features having a critical dimension less than about 10 nm, such as about 5 nm. Disclosed embodiments may be performed at a wide range of temperatures, such as between about −10° C. and about 300° C., or between about 20° C. and about 60° C.

Figure 3:
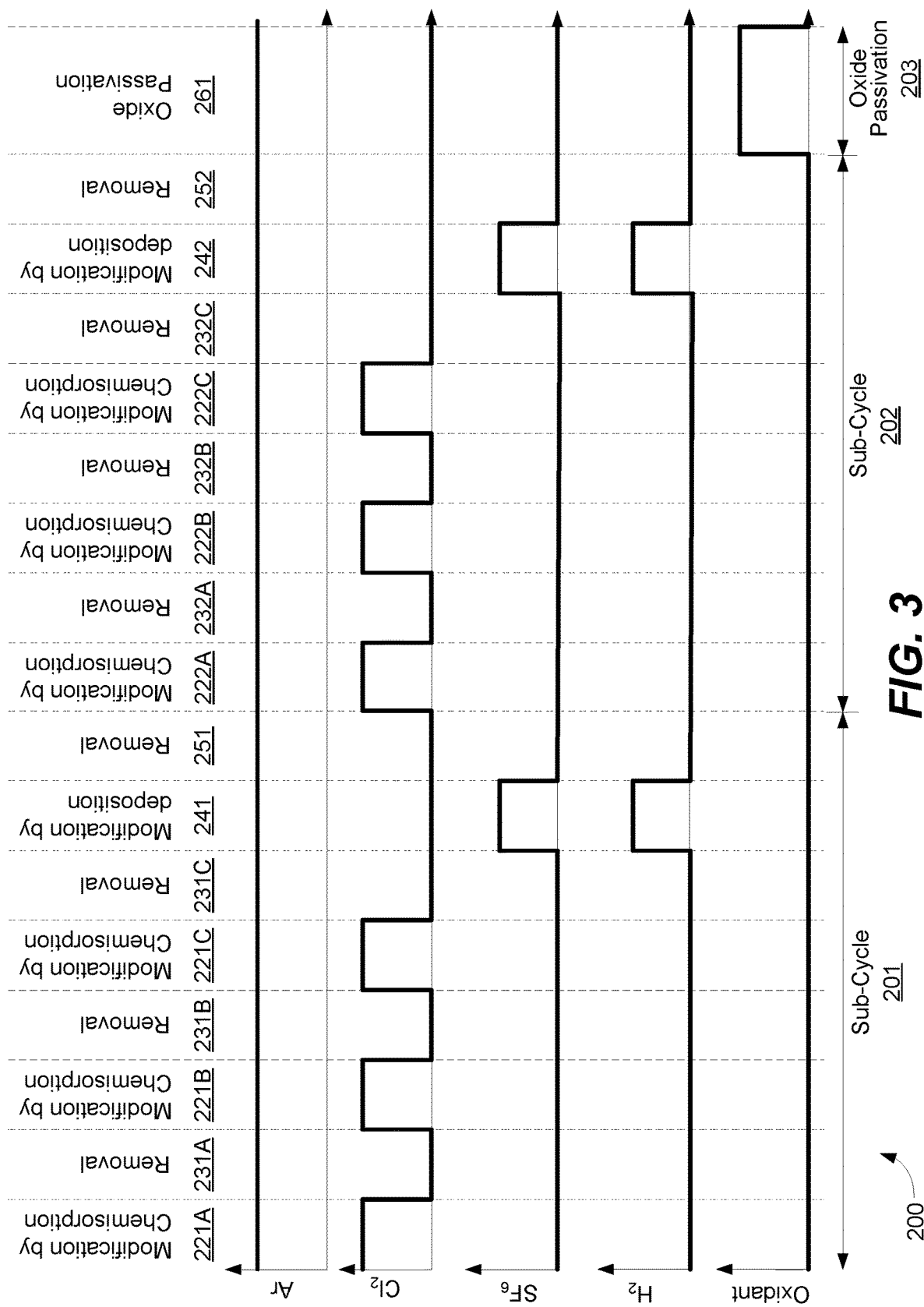
FIG. 3 is a timing schematic diagram depicting an example of operations performed in accordance with certain disclosed embodiments.

FIG. 3 shows an example timing diagram with relative flows of argon, chlorine, sulfur hexafluoride, hydrogen, and an oxidant. Process 200 includes a first sub-cycle 201 which is then repeated in sub-cycle 202, and an oxide passivation regime 203. Sub-cycle 201 includes three repetitions of modification by chemisorption and removal (ALE-I), and one repetition of modification by deposition and removal (ALE-II). Such an embodiment may be represented by Equation 3 below for x cycles of ALE-I and y cycles of ALE-II.

$$2(x+y)+1 \text{ oxide passivation} \qquad \text{Eqn. 3}$$

During modification by chemisorption 221A, argon is on as a carrier gas, and chlorine is flowed to modify the substrate surface, while other gas flows are off. During removal 231, argon is remained on and ignited to remove the modified surface, while all other gas flows are off. These are repeated two more times as indicated in modification by chemisorption 221B, removal 231B, modification by chemisorption 221C, and removal 231C. The modification by chemisorption phases 221A, 221B, 221C may correspond to operation 220 of FIG. 2.

During modification by deposition 241, argon is on as a carrier gas, and sulfur hexafluoride and hydrogen are flowed to deposit a sulfur-containing material on the substrate surface to modify it. In removal 251, argon is flowed and the modified surface is removed while other gas flows are turned off. Modification by deposition 241 may correspond to operation 240 of FIG. 2, and removal 251 may refer to operation 250 of FIG. 2. The sub-cycle 201 is repeated in sub-cycle 202 as shown, with three repetitions of modification of chemisorption (222A, 222B, 222C) and removal (232A, 232B, and 232C), followed by one cycle of modification by deposition (242) and removal (252). Subsequently, during oxide passivation 261, which may correspond to operation 260 of FIG. 2, oxidant flow is turned on with carrier gas argon while other gases are turned off to deposit a thin layer of oxide on the substrate surface and passivate the substrate surface.

Disclosed embodiments may be suitable for forming nanowire fin structures in gate all around (GAA) devices. In a fin structure, the sidewalls of the fin are vertical. For a nanowire structure, the cylinder sidewalls around the wire are vertical. Disclosed embodiments are suitable for forming these structures by preventing lateral etching and maintaining good control over the etch profile by toggling process conditions such as the various variables n, x, y, and z as described above, thereby resulting in smooth, vertical sidewalls.

Apparatus

Disclosed embodiments may be performed in any suitable etching chamber or apparatus, such as the Kiyo® FX, available from Lam Research Corporation of Fremont, Calif. In some embodiments, an inductively coupled plasma (ICP) reactor may be used. Such ICP reactors have also been described in U.S. Patent Application Publication No. 2014/

0170853, filed Dec. 10, 2013, and titled "IMAGE REVERSAL WITH AHM GAP FILL FOR MULTIPLE PATTERNING," hereby incorporated by reference for the purpose of describing a suitable ICP reactor for implementation of the techniques described herein. Although ICP reactors are described herein, in some embodiments, it should be understood that capacitively coupled plasma reactors may also be used.

An example etching chamber or apparatus may include a chamber having chamber walls, a chuck for holding a substrate or wafer to be processed which may include electrostatic electrodes for chucking and dechucking a wafer and may be electrically charged using an RF power supply, an RF power supply configured to supply power to a coil to generate a plasma, and gas flow inlets for inletting gases as described herein. For example, modification chemistry gases for chemisorption (such as chlorine-containing gases for forming plasm) and/or deposition (such as $SF_6$) may be flowed to the etching chamber for performing ALE-I or ALE-II. In some embodiments, an oxygen-containing gas may be flowed to the chamber for oxide passivation. In some embodiments, an apparatus may include more than one chamber, each of which may be used to etch, deposit, or process substrates. The chamber or apparatus may include a system controller for controlling some or all of the operations of the chamber or apparatus such as modulating the chamber pressure, inert gas flow, plasma power, plasma frequency, reactive gas flow (e.g., chlorine-containing gas, oxygen-containing gas, fluorine-containing gas, etc.); bias power, temperature, vacuum settings; and other process conditions. In various embodiments, apparatuses for performing atomic layer etching may be incorporated or integrated with a high voltage bias pulsing chamber and/or high voltage bias pulsing processes.

Figure 4:
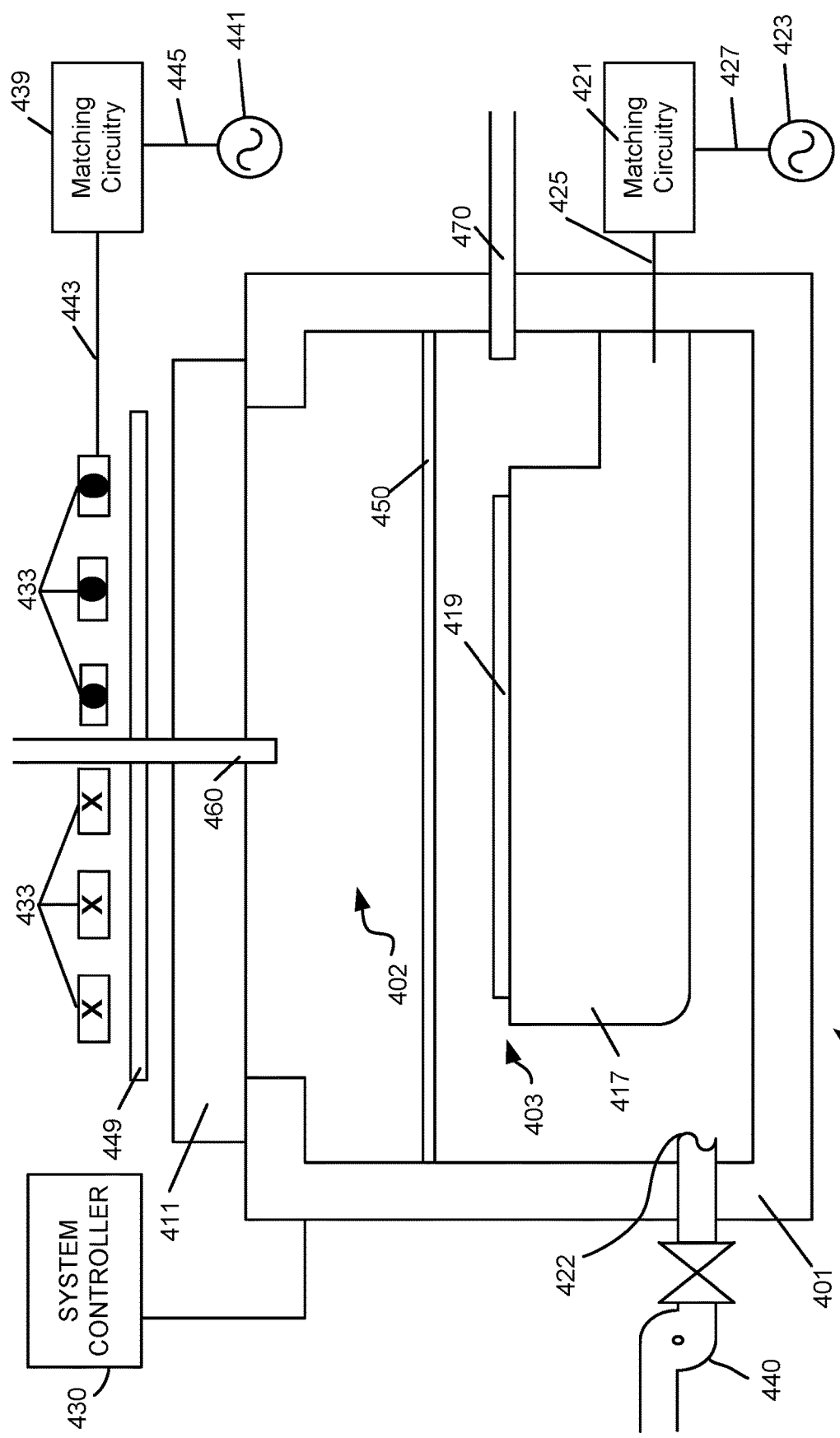
FIG. 4 is a schematic diagram of an example process chamber for performing certain disclosed embodiments.

FIG. 4 schematically shows a cross-sectional view of an inductively coupled plasma integrated etching and deposition apparatus 400 appropriate for implementing certain embodiments herein, an example of which is a Kiyo™ reactor, produced by Lam Research Corp. of Fremont, Calif. The inductively coupled plasma apparatus 400 includes an overall process chamber 401 structurally defined by chamber walls and a window 411. The chamber walls may be fabricated from stainless steel or aluminum. The window 411 may be fabricated from quartz or other dielectric material. An optional internal plasma grid 450 divides the overall processing chamber 401 into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of a wafer 419, when present over chuck 417. The chuck 417 also includes electrostatic electrodes for chucking and dechucking the wafer. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "●" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449 is positioned between the coil 433 and the window 411. The Faraday shield 449 is maintained in a spaced apart relationship relative to the coil 433. The Faraday shield 449 is disposed immediately above the window 411. The coil 433, the Faraday shield 449, and the window 411 are each configured to be substantially parallel to one another. The Faraday shield may prevent metal or other species from depositing on the dielectric window of the plasma chamber 401.

Process gases (e.g. chlorine, argon, sulfur hexafluoride, sulfur dioxide, hydrogen, etc.) may be flowed into the processing chamber 401 through one or more main gas flow inlets 460 positioned in the upper chamber 402 and/or through one or more side gas flow inlets 470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 440, may be used to draw process gases out of the process chamber 401 and to maintain a pressure within the process chamber 401. For example, the pump may be used to evacuate the chamber 401 during a purge operation of ALE. A valve-controlled conduit may be used to fluidically connect the vacuum pump to the processing chamber 401 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced more complex gas flow inlets, one or more showerheads, for example. The Faraday shield 449 and/or optional grid 450 may include internal channels and holes that allow delivery of process gases to the chamber 401. Either or both of Faraday shield 449 and optional grid 450 may serve as a showerhead for delivery of process gases. In some embodiments, a liquid vaporization and delivery system may be situated upstream of the chamber 401, such that once a liquid reactant or precursor is vaporized, the vaporized reactant or precursor is introduced into the chamber 401 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 selectively etch features of and deposit layers on the wafer.

If the plasma grid is used such that there is both an upper sub-chamber 402 and a lower sub-chamber 403, the inductive current acts on the gas present in the upper sub-chamber 402 to generate an electron-ion plasma in the upper sub-chamber 402. The optional internal plasma grid 450 limits the amount of hot electrons in the lower sub-chamber 403. In some embodiments, the apparatus is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 403 through port 422. The chuck 417 disclosed herein may operate at elevated temperatures ranging between about 10° C. and about 250° C. The temperature will depend on the process operation and specific recipe.

Chamber 401 may be coupled to facilities (not shown) when installed in a clean room or a fabrication facility. Facilities include plumbing that provide processing gases, vacuum, temperature control, and environmental particle control. These facilities are coupled to chamber 401, when installed in the target fabrication facility. Additionally, chamber 401 may be coupled to a transfer chamber that allows robotics to transfer semiconductor wafers into and out of chamber 401 using typical automation.

In some embodiments, a system controller 430 (which may include one or more physical or logical controllers) controls some or all of the operations of a processing chamber. The system controller 430 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 430 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 430, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 430 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
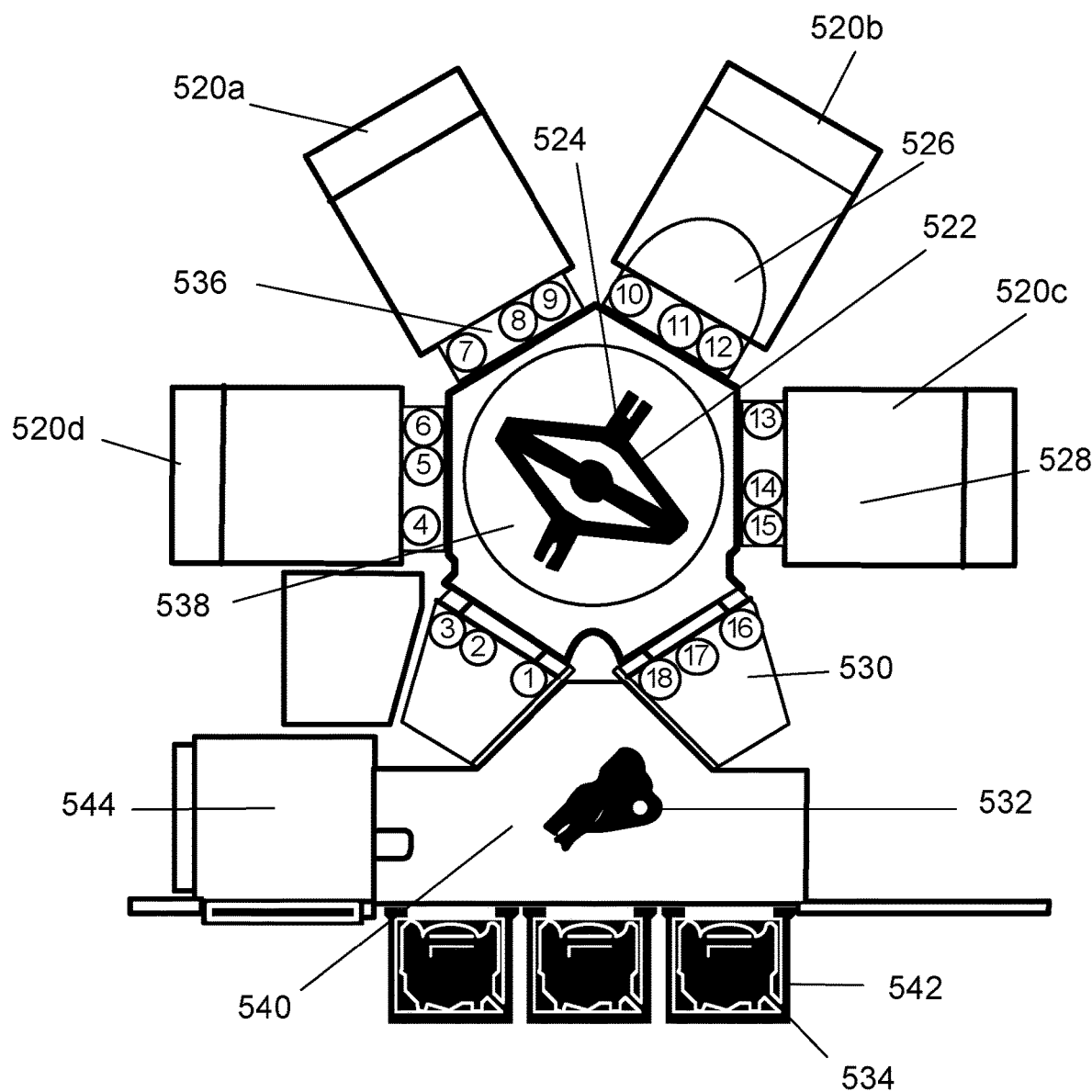
FIG. 5 is a schematic diagram of an example process apparatus for performing certain disclosed embodiments.

FIG. 5 depicts a semiconductor process cluster architecture with various modules that interface with a vacuum transfer module 538 (VTM). The arrangement of transfer modules to "transfer" wafers among multiple storage facilities and processing modules may be referred to as a "cluster tool architecture" system. Airlock 530, also known as a loadlock or transfer module, is shown in VTM 538 with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. In some embodiments, ALD for oxide passivation and ALE-I and/or ALE-II are performed in the same module. In some embodiments, ALD for oxide passivation and ALE-I and/or ALE-II are performed in different modules of the same tool. One or more of the substrate etching processing modules (any of 520a-520d) may be implemented as disclosed herein, i.e., for performing ALE-I, performing ALE-II, performing oxide passivation by CVD, performing oxide passivation by ALD, and other suitable functions in accordance with the disclosed embodiments. Airlock 530 and process module 520 may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside process module 520 is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because airlock modules have the ability to match the environment between an ATM and a VTM, the wafer 526 is able to move between the two pressure environments without being damaged. From the airlock module 530, the wafer 526 is moved by robot 522 through VTM 538 and into one of the process modules 520a-520d. In order to achieve this wafer movement, the robot 522 uses end effectors 524 on each of its arms. Once the wafer 526 has been processed, it is moved by robot 522 from the process modules 520a-520d to an airlock module 530. From here, the wafer 526 may be moved by the front-end robot 532 to one of the FOUPs 534 or to the aligner 544.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 4 may be implemented with the tool in FIG. 5.

EXPERIMENTAL

Experiments described below were performed at a chamber temperature of 60° C.

Experiment 1

Figure 6:
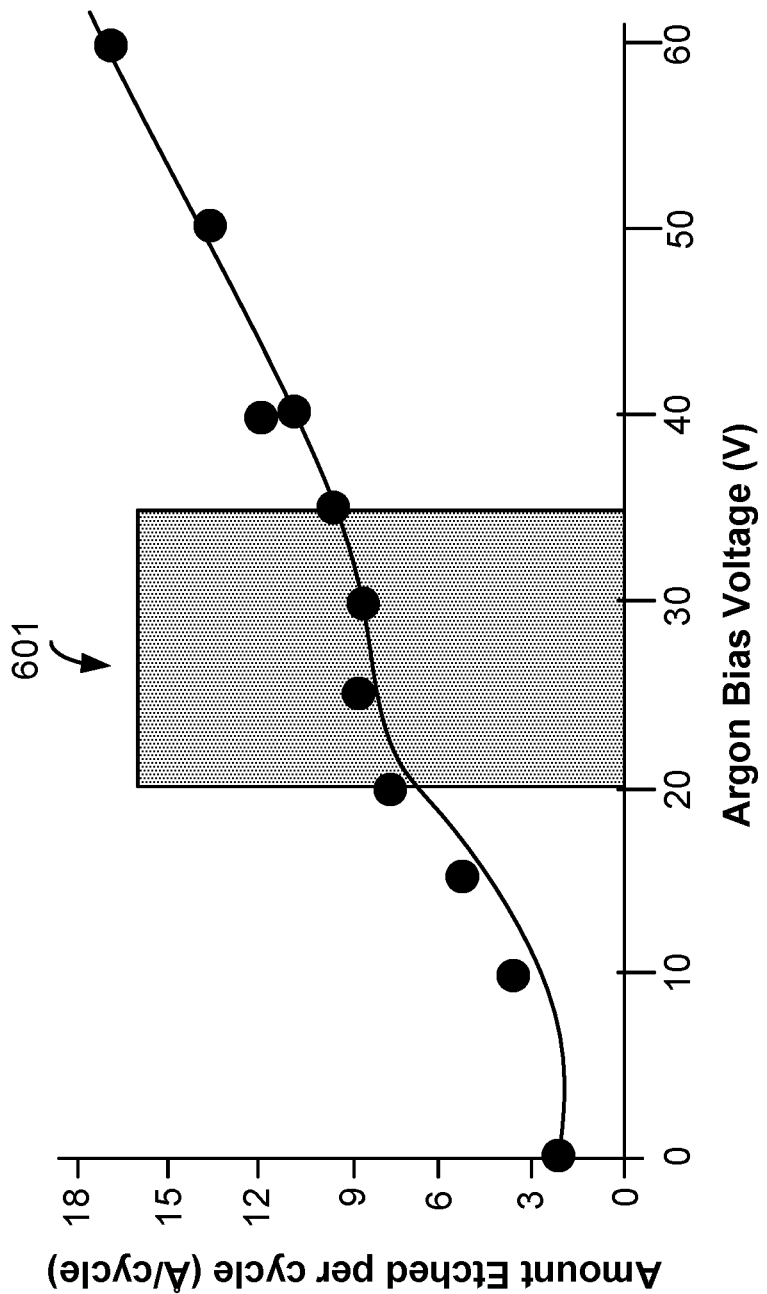
FIG. 6 is a graph showing amount of germanium etched per cycle as a function of argon bias voltage as obtained from experimental results.

An experiment was conducted to determine the amount etched per cycle for bias voltages to be used for etching germanium. The etch rate (amount etched per cycle in A/cycle) was determined for bias voltages ranging from 0V to 60V, using an argon removal gas. The resulting ALE window 601 was determined to be between 20 V and 35 V as shown in FIG. 6. In contrast, the ALE window obtained for silicon was about 50 V.

Experiment 2

Figure 7:
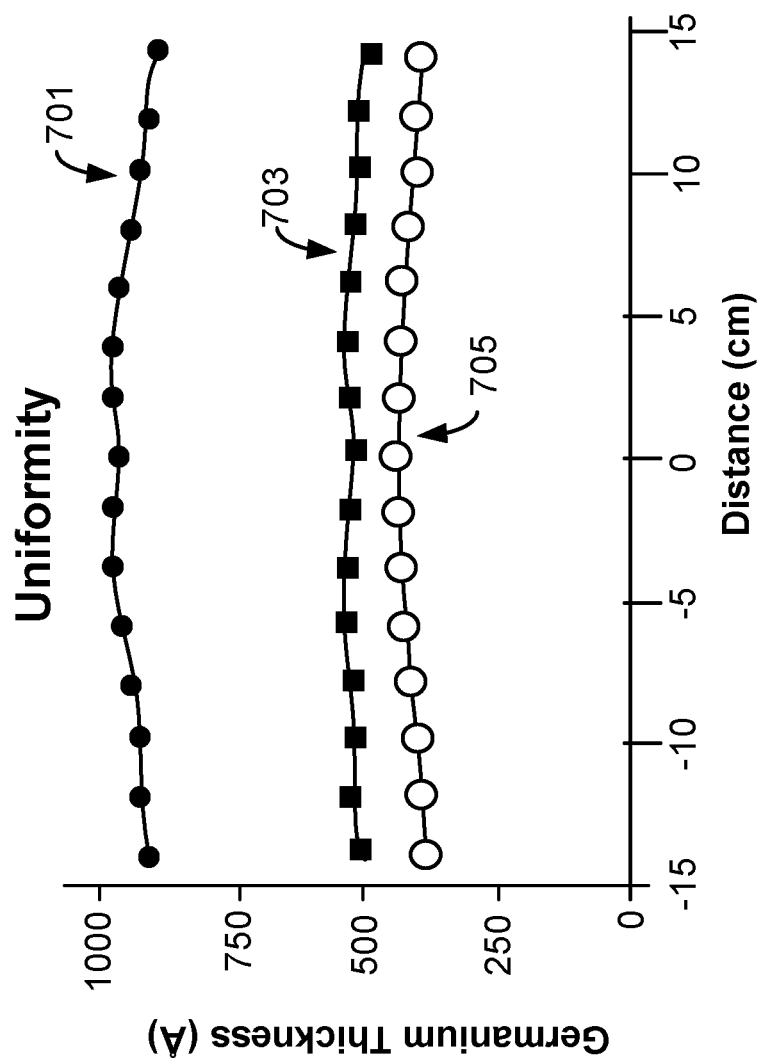
FIG. 7 is a graph showing uniformity of germanium over a wafer before and after performing certain disclosed embodiments.

ALE-I was performed on a germanium substrate. ALE-I was performed using the following cycle: modification by exposure to chlorine-containing plasma ($Cl_2$), purge, removal using argon, and purge. The thickness of the germanium before etching (pre-etch shown in 701), and after etching (post-ALE shown in 703) by exposing the substrate to cycles of alternating exposures of $Cl_2$ (modification) and argon (removal) are plotted on the graph in FIG. 7. The net etch (705) was determined. The x-axis depicts distance on the wafer to show uniformity across the wafer.

Images of the substrate before and after etch showed that the smoothness maintained even after etch, with a 0.8 nm RMS pre-etch and 0.9 nm RMS post-etch after etching 65 nm of germanium.

Experiment 3

An experiment was conducted for performing the sequence in Eqn. 4 for multiple repetitions of the cycles on a germanium substrate for patterned substrates having fins of different heights (55 nm, 65 nm, 91 nm, and 110 nm). Eqn. 4 includes 3 repetitions of 3 cycles of ALE-I and 1 cycle of ALE-II, with 1 exposure to oxygen-containing plasma at 100 W. This sequence may be represented by the following equation $$3(3\text{ALE-I}+1\text{ALE-II})+1 \text{ oxide passivation} \qquad \text{Eqn. 4}$$

The images of the substrates after etching showed smooth vertical profiles.

The results suggest that the vertical etch profile may be transferred to different etch depths using the same ratio of ALE-I, ALE-II, and oxide passivation. Similar experiments were conducted for tubular shallow trench isolation structures which also exhibited smooth vertical sidewall profiles.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching a substrate, the method comprising:
   (a) etching a substrate by removing layers of material using sequential self-limiting reactions by performing n cycles of:
      (i) exposing the substrate to a reactive gas to modify a surface of the substrate without etching the surface of the substrate to form a modified surface, wherein the reactive gas comprises a sulfur-containing gas and wherein the surface of the substrate is modified by deposition, and
      (ii) after exposing the substrate to the reactive gas, exposing the modified surface of the substrate to a removal species to remove at least some of the modified surface; and
   (b) periodically exposing the substrate to an oxygen-containing plasma to passivate the surface of the substrate; and
   wherein n is an integer between and including 1 and 100.

2. The method of claim 1, wherein the reactive gas further comprises a second reactive gas selected from the group consisting of hydrogen and a halogen-containing gas.

3. The method of claim 1, wherein the surface of the substrate comprises germanium that is modified by deposition.

4. The method of claim 3, wherein the sulfur-containing gas is selected from the group consisting of sulfur hexafluoride, sulfur dioxide, and hydrogen sulfide.

5. The method of claim 2, wherein the second reactive gas is a halogen-containing gas selected from the group consisting of chlorine, boron chloride, hydrogen chloride, hydrogen bromide, bromine, nitrogen fluoride, and fluorine; and wherein the surface of the substrate is modified by chemisorption.

6. The method of claim 2, wherein the halogen-containing gas is selected from the group consisting of nitrogen trifluoride, fluorocarbons, and fluorine.

7. The method of claim 6, wherein the fluorocarbons comprise a gas selected from the group consisting of carbon tetrafluoride ($CF_4$), hexafluoro-2-butyne ($C_4F_6$), fluoromethane ($CH_3F$), and combinations thereof.

8. The method of claim 1, wherein the removal species is generated by introducing an activating gas and igniting a plasma using a plasma power between about 50 W and about 1000 W.

9. The method of claim 1, wherein x is a number of cycles for which (i) and (ii) are repeated using a halogen-containing gas as the reactive gas and y is a number of cycles for which (i) and (ii) are repeated using a sulfur-containing gas, and wherein a ratio of x to y is between 2:1 and 20:1.

10. The method of claim 1, wherein a bias is not applied during exposure to the removal species and bias power is 0 V.

11. The method of claim 1, wherein a bias is applied during exposure to the removal species to facilitate removal of the at least some of the modified surface.

12. The method of claim 11, wherein bias power is less than about 50 V.

13. The method of claim 11, wherein the bias is applied continuously, and wherein bias power is between about 40V and about 100V.

14. The method of claim 11, wherein the bias is pulsed for a duty cycle between about 5% and about 40% and wherein bias power is between about 300V and about 1000V.

15. The method of claim 11, wherein the bias is pulsed for a duty cycle of about 50%, and wherein bias power is between about 100V and about 300V.

16. The method of claim 1, wherein the oxygen-containing plasma is generated by introducing an oxygen-containing gas selected from the group consisting of oxygen, carbon dioxide, and sulfur dioxide; and igniting a plasma.

17. The method of claim 1, wherein periodically exposing the substrate to the oxygen-containing plasma to passivate the surface of the substrate comprises depositing an oxide layer on the surface of the substrate by atomic layer deposition.

18. The method of claim 17, wherein etching the substrate by performing the n cycles and periodically exposing the substrate to the oxygen-containing plasma is performed without breaking vacuum.

19. A method of etching a substrate, the method comprising:
   removing layers of material of a substrate by using sequential self-limiting reactions by:
      (a) exposing a substrate to a halogen-containing gas to modify a first surface of the substrate by chemisorption to form a first modified surface;
      (b) after exposing the substrate to the halogen-containing gas, exposing the substrate to a removal gas to remove at least some of the first modified surface;
      (c) exposing the substrate to a sulfur-containing gas to modify a second surface of the substrate by deposition to form a second modified surface;
      (d) after exposing the substrate to the sulfur-containing gas, exposing the substrate to the removal gas to remove at least some of the second modified surface; and
      (e) repeating (a)-(d) and periodically exposing the substrate to an oxygen-containing plasma to passivate surfaces of the substrate; and
   wherein the substrate comprises germanium.

20. The method of claim 19, wherein the etching produces atomically smooth vertical surfaces, substantially parallel with etch direction, in features in the substrate.

* * * * *